United States Patent
Wang

(10) Patent No.: US 11,496,098 B2
(45) Date of Patent: Nov. 8, 2022

(54) DOHERTY POWER AMPLIFIER AND DEVICE

(71) Applicant: Telefonaktiebolaget LM Ericsson (publ), Stockholm (SE)

(72) Inventor: Zhancang Wang, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/643,071

(22) PCT Filed: Oct. 13, 2017

(86) PCT No.: PCT/CN2017/106017
§ 371 (c)(1),
(2) Date: Feb. 28, 2020

(87) PCT Pub. No.: WO2019/071563
PCT Pub. Date: Apr. 18, 2019

(65) Prior Publication Data
US 2020/0195200 A1     Jun. 18, 2020

(51) Int. Cl.
*H03F 1/02* (2006.01)
*H01P 3/08* (2006.01)
(Continued)

(52) U.S. Cl.
CPC .......... *H03F 1/0288* (2013.01); *H01P 3/081* (2013.01); *H03F 3/189* (2013.01); *H03F 3/24* (2013.01)

(58) Field of Classification Search
CPC .......... H03F 1/0288; H03F 3/189; H03F 3/24; H01P 3/081
(Continued)

(56) References Cited

U.S. PATENT DOCUMENTS

2004/0189381 A1*  9/2004  Louis .................. H03F 3/602
                                          330/124 R
2013/0093534 A1   4/2013  Mei
(Continued)

FOREIGN PATENT DOCUMENTS

| CN | 202872733 U | 4/2013 |
| CN | 205029630 U | 2/2016 |
| WO | WO-2004088837 A2 * | 10/2004 ........... H03F 1/0266 |

OTHER PUBLICATIONS

Olukoya et al., "Miniaturized Quadrature Hybrid Couplers based on Novel U-shaped Transmission Lines", published in Microwave and Optical Technology Letters, Dec. 21, 2018 (Year: 2018).*
(Continued)

*Primary Examiner* — Hafizur Rahman
(74) *Attorney, Agent, or Firm* — Sage Patent Group

(57) ABSTRACT

A Doherty power amplifier and a device are disclosed. In a combiner of the Doherty power amplifier, a first input port and a termination port are open coupled by at least two coupled microstrip lines and/or a second input port and an output port are open coupled by at least two coupled microstrip lines. Therefore, a balanced amplitude bandwidth may be obtained and may be much broader than that of the existing solutions, in addition, a controllable size or a potentially small size may be realized. Furthermore, the Doherty power amplifier in this disclosure may provide large $2^{nd}$ harmonic suppression to meet product spectrum mask requirements.

20 Claims, 8 Drawing Sheets

(51) Int. Cl.
  *H03F 3/189* (2006.01)
  *H03F 3/24* (2006.01)
(58) Field of Classification Search
  USPC .......................................................... 330/250
  See application file for complete search history.

(56) References Cited

U.S. PATENT DOCUMENTS

| | | | |
|---|---|---|---|
| 2015/0070094 A1* | 3/2015 | Pham .................... | H03F 1/0288 330/295 |
| 2015/0091651 A1 | 4/2015 | Seneviratne et al. | |
| 2021/0143782 A1* | 5/2021 | Wang ....................... | H03F 3/60 |

OTHER PUBLICATIONS

Nouri et al., "Novel Compact Branch-Line Coupler Using Non-Uniform Folded Transmission Line and Shunt Step Impedance Stub With Harmonics Suppressions", published in ACES Journal, vol. 31, No. 4, Apr. 2016 (Year: 2016).*
Tian et al., "Miniaturized quadrature hybrid coupler using composite planar transmission lines" published in Electronics Letters, Jul. 2019 (Year: 2019).*
International Search Report and Written Opinion of the International Searching Authority for PCT International Application No. PCT/CN2017/106017 dated Jul. 17, 2018, 9 pages.
Giofre et al., "A Doherty Architecture With High Feasibility and Defined Bandwidth Behavior," IEEE Transactions on Microwave Theory and Techniques, vol. 61, No. 9, Sep. 2013, pp. 3308-3317.
Mitzlaff, "Novel Combiner Circuits for a Doherty RF Power Amplifier," Motorola, Inc., Jul. 22, 2002, 12 pages.
Anaren, "Xinger III—Doherty Combiner," Data Sheet for Model X3DC19P1S, Rev D, 6 pages.
Piazzon et al., "A Wideband Doherty Architecture With 36% of Fractional Bandwidth," IEEE Microwave and Wireless Components Letters, vol. 23, No. 11, Nov. 2013, 3 pages.
European Search Report for European Patent Application No. 17928358.5 dated Aug. 4, 2020, 11 pages.
Giofre et al., "New Output Combiner for Doherty Amplifiers," IEEE Microwave and Wireless Components Letters, vol. 23, No. 1, Jan. 2013, pp. 31-33.
Arriola et al., "Wideband 3 dB Branch Line Coupler Based on lambda/4 Open Circuited Coupled Lines," IEEE Microwave and Wireless Components Letters, vol. 21, No. 9, Sep. 2011, pp. 486-488.
Tadashi et al., "Broadband Branch-Line Coupler with Very Loose Coupling Utilizing Open/Short-Circuited Coupled-Transmission Lines," Proceedings of the 44th European Microwave Conference, Oct. 2014, Rome, Italy, pp. 89-92.
Communication pursuant to Article 94(3) EPC for European Patent Application No. 17928358.5 dated Mar. 11, 2021, 11 pages.
Velidi et al, "Compact coupled line quadrature hybrid coupler with enhanced balance bandwidth," Applied Electromagnetics Conference (AEMC), 2011 IEEE, Dec. 18, 2011 (Dec. 18, 2011), pp. 1-4.
Khusboo et al, "Compact fractal shaped, unequal length branch-line coupler for dual-band applications," 2014 Twentieth National Conference on Communications (NCC), Feb. 28, 2014 (Feb. 28, 2014), pp. 1-5.
Das et al, "A compact branch-line coupler using folded microstrip lines", 2013 International Conference on Microwave and Photonics (ICMAP), IEEE, Dec. 13, 2013 (Dec. 13, 2013), pp. 1-3.
Summons to Attend Oral Proceedings pursuant to Rule 115(1) EPC for European Patent Application No. 17928358.5, mailed Feb. 9, 2022, 14 pages.
Chen et al, "Effective Design of Novel Compact Fractal-Shaped Microstrip Coupled-Line Bandpass Filters for Suppression of the Second Harmonic", IEEE Microwave and Wireless Components Letters, vol. 19, No. 2, Feb. 2009, 3 pages.
Wang et al, "Miniaturized Spurious Passband Suppression Microstrip Filter Using Meandered Parallel Coupled Lines," IEEE Transactions on Microwave Theory and Techniques, vol. 53, No. 2, Feb. 2005, 7 pages.

* cited by examiner

DOHERTY POWER AMPLIFIER AND DEVICE

CROSS REFERENCE TO RELATED APPLICATION

This application is a 35 U.S.C. § 371 national stage application of PCT International Application No. PCT/CN2017/106017, filed on Oct. 13, 2017, the disclosure and content of which is incorporated herein by reference in its entirety.

TECHNICAL FIELD

Embodiments of the present disclosure generally relate to the field of electronic components of telecommunications, and more particularly, to a Doherty power amplifier (PA) and a device.

BACKGROUND

In a base station of the fourth generation (4G) and beyond, advanced digital modulation schemes are used for high spectrum efficiency. A radio frequency (RF) signal may exhibit a large peak to average power ratio (PAPR), which is amplified in a power amplifier. Therefore, an instantaneous transmission power will vary extensively and fast. Traditional radio frequency power amplifier would suffer from rather low average efficiency with a high PAPR.

Although a classic Doherty power amplifier meets the efficiency and linearity requirements, it is an inherent narrow-band solution, because of use of frequency-limited quarter wavelength transmission lines. Therefore, a classic Doherty power amplifier may not satisfy broadband requirements of emerging wireless standards.

In a Doherty power amplifier, a source of limited bandwidth may be an impedance inverter which connects a carrier amplifier (or may be referred to as a main amplifier, or a carrier path) and a peaking amplifier (or may be referred to as a peaking path) together. It is essential in the Doherty power amplifier to transform a low common impedance (such as $Z_0/2$) into a high impedance (such as $2*Z_0$) seen as a load of the carrier amplifier in a low power range. Also, it assists to have a proper active load modulation of a higher impedance $2*Z_0$ into a lower impedance $Z_0$ in the Doherty power amplifier. The above characteristics can be achieved at its center frequency.

However, once any deviation from the center frequency occurs, the impedance inverter may be no longer having a quarter wavelength. Then, a purely resistive load seen by the carrier amplifier would change into a complex load, leading to a non-optimal load modulation as a frequency deviation is enlarged. Similar issues may happen to a real-to-real impedance transformer as well. A precision of matching a common load impedance into a final system load impedance may deteriorate owning to a limited frequency response. Therefore, there are many efforts to improve a broadband performance of combiners for the Doherty power amplifiers.

This section introduces aspects that may facilitate a better understanding of the disclosure. Accordingly, the statements of this section are to be read in this light and are not to be understood as admissions about what is in the prior art or what is not in the prior art.

SUMMARY

The inventor has found that in existing solutions, for example, narrow bandwidth performance is delivered when a quadrature hybrid structure is used as a combiner of a Doherty power amplifier. In addition, extending bandwidth by cascading more stages may not be feasible for technical implementation of products; and a way to extending bandwidth but without adding too much printed circuit board (PCB) area budget is highly desired.

Furthermore, the existing solutions almost all use quarter wavelength lines, whose size was determined by the center frequency of the Doherty power amplifier. A controllable size of a combiner of the Doherty power amplifier is highly desired for various application scenarios.

Furthermore, the existing combiners of the Doherty power amplifiers are fixed with unique characteristics. Flexible characteristic of impedance matching or termination is highly desired. In addition, harmonic suppression function in the existing combiners of the Doherty power amplifiers also is lacked, especially for Gallium Nitride (GaN) High Electron Mobility Transistor (HEMT) power amplifier designs.

To solve at least part of the above problems, a Doherty power amplifier and a device are provided in the present disclosure. It can be appreciated that embodiments of the present disclosure are not limited to a multiple input multiple output (MIMO) transmitter, but could be more widely applied to any application scenario where similar problems exist.

Various embodiments of the present disclosure mainly aim at providing a Doherty power amplifier, for example, configured in a multiple input multiple output (MIMO) transmitter. The transmitter could be, for example, configured in a terminal device or a network device.

Other features and advantages of embodiments of the present disclosure will also be understood from the following description of specific embodiments when read in conjunction with the accompanying drawings, which illustrate, by way of example, the principles of embodiments of the present disclosure.

In general, embodiments of the present disclosure provide a solution of a Doherty power amplifier and a device to overcome the one or more problems pointed out in the above description.

In a first aspect, a Doherty power amplifier is provided. The Doherty power amplifier at least includes: a power divider, a carrier amplifier, a peaking amplifier and a combiner; the combiner is configured to combine output signals of the carrier amplifier and the peaking amplifier and at least include a first input port, a second input port, an output port and a termination port.

The first input port and the termination port are open coupled by at least two coupled microstrip lines and/or the second input port and the output port are open coupled by at least two coupled microstrip lines; while the first input port and the second input port are connected by a quarter wavelength transmission line and/or the termination port and the output port are connected by a quarter wavelength transmission line.

In one embodiment, the first input port is connected to the carrier amplifier and the second input port is connected to the peaking amplifier to form a non-inverted load modulation combiner.

In one embodiment, the first input port is connected to the peaking amplifier and the second input port is connected to the carrier amplifier to form an inverted load modulation combiner.

In one embodiment, the coupled microstrip lines include open coupled stubs and are broadband equivalents of a low impedance quarter wavelength transmission line.

In one embodiment, the coupled microstrip lines between the first input port and the termination port are equivalently parallel to the coupled microstrip lines between the second input port and the output port.

In one embodiment, load of the termination port includes one or more of an open stub, a short stub, and an equivalent lumped reactive load.

In one embodiment, load of the termination port has a same effect as placing offset lines in series with the first input port and the second input port for the output signals of the carrier amplifier and the peaking amplifier, respectively.

In one embodiment, an equivalent electrical length of the load of the termination port is configured to be adjusted to realize tradeoff between an intermodulation distortion level and efficiency of the Doherty power amplifier.

In one embodiment, one or more of the following lines are configured to be U-shaped folded structures: the coupled microstrip lines between the first input port and the termination port; the coupled microstrip lines between the second input port and the output port; the quarter wavelength transmission line between the first input port and the second input port; and the quarter wavelength transmission line between the output port and the termination port.

In one embodiment, the coupled microstrip lines are configured to suppress amplitude imbalance and/or a second harmonic level of the Doherty power amplifier. For example, the two coupled microstrip lines can be configured to manipulate amplitude imbalance and/or a second harmonic level of the Doherty power amplifier by switching between an open state and a closed state.

In one embodiment, the coupled microstrip lines have relatively low equivalent port impedance while the quarter wavelength transmission lines have relatively high port impedance.

In one embodiment, an even mode electrical length and an odd mode electrical length of the coupled microstrip lines are equal.

In one embodiment, an even mode impedance of the coupled microstrip lines is in a range of 100~200 Ohm, while an odd mode impedance of the coupled microstrip lines is in a range of 20~100 Ohm.

In one embodiment, the higher a value of a coupling factor of the coupled microstrip lines is, the broader an obtained bandwidth of a balanced amplitude is.

In a second aspect, a device is provided. The device includes the Doherty power amplifier as illustrated in the first aspect.

In one embodiment, the device is a terminal device or a network device in a wireless communication system.

According to various embodiments of the present disclosure, in a combiner of Doherty power amplifier, a first input port and a termination port are open coupled by at least two coupled microstrip lines and/or a second input port and an output port are open coupled by at least two coupled microstrip lines.

Therefore, a balanced amplitude bandwidth can be obtained and it is much broader than that of the existing solutions, which is promising for a broadband Doherty power amplifier with good consistency in output power and linearity.

In addition, a controllable size or a potentially small size of a combiner of Doherty power amplifier in this disclosure can be realized, which could be meaningful for product volume miniaturization.

Furthermore, the Doherty power amplifier in this disclosure can provide large $2^{nd}$ harmonic suppression to meet product spectrum mask requirements; and flexible characteristic of impedance matching or termination can be obtained.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

Figure 1:
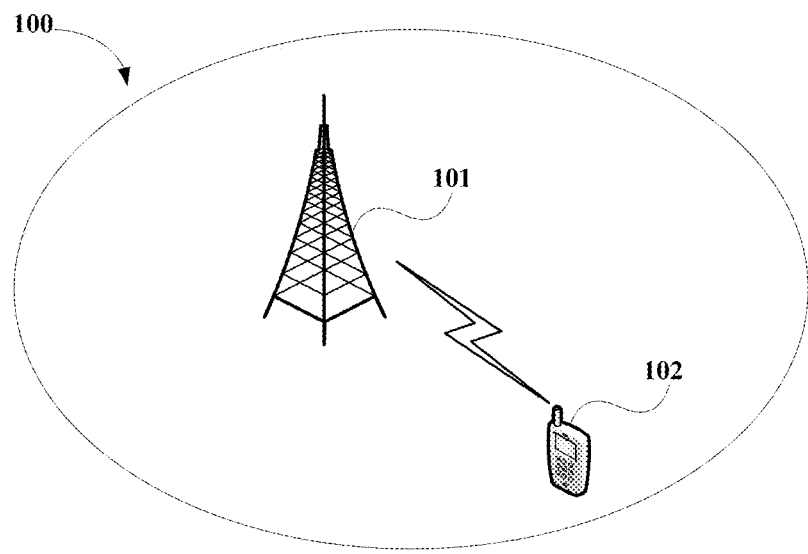
FIG. 1 is a schematic diagram of a wireless communication network.

The present disclosure will now be described with reference to several example embodiments. It should be understood that these embodiments are discussed only for the purpose of enabling those skilled persons in the art to better understand and thus implement the present disclosure, rather than suggesting any limitations on the scope of the present disclosure.

As used herein, the term "wireless communication network" refers to a network following any suitable communication standards, such as LTE-Advanced (LTE-A), LTE, Wideband Code Division Multiple Access (WCDMA), High-Speed Packet Access (HSPA), and so on. Furthermore, the communications between a terminal device and a network device in the wireless communication network may be performed according to any suitable generation communication protocols, including, but not limited to, the first generation (1G), the second generation (2G), 2.5G, 2.75G, the third generation (3G), the fourth generation (4G), 4.5G, the future fifth generation (5G) communication protocols, and/or any other protocols either currently known or to be developed in the future.

The term "network device" refers to a device in a wireless communication network via which a terminal device accesses the network and receives services therefrom. The network device refers a base station (BS), an access point (AP), a server, a controller or any other suitable device in the wireless communication network. The BS may be, for example, a node B (NodeB or NB), an evolved NodeB (eNodeB or eNB), a gNode B (gNB), a relay, a low power node such as a femto, a pico, and so forth.

Yet further examples of network device include multi-standard radio (MSR) radio equipment such as MSR BSs, base transceiver stations (BTSs), transmission points, transmission nodes. More generally, however, network device may represent any suitable device (or group of devices) capable, configured, arranged, and/or operable to enable and/or provide a terminal device access to the wireless communication network or to provide some service to a terminal device that has accessed the wireless communication network.

The term "terminal device" refers to any end device that can access a wireless communication network and receive services therefrom. By way of example and not limitation, the terminal device refers to a mobile terminal, user equipment (UE), or other suitable devices. The UE may be, for example, a Subscriber Station (SS), a Portable Subscriber Station, a Mobile Station (MS), or an Access Terminal (AT). The terminal device may include, but not limited to, portable computers, image capture terminal devices such as digital cameras, gaming terminal devices, music storage and playback appliances, a mobile phone, a cellular phone, a smart phone, a tablet, a wearable device, a personal digital assistant (PDA), a vehicle, and the like.

The terminal device may support device-to-device (D2D) communication, for example by implementing a 3 GPP standard for sidelink communication, and may in this case be referred to as a D2D communication device.

As yet another specific example, in an Internet of Things (IoT) scenario, a terminal device may represent a machine or other device that performs monitoring and/or measurements, and transmits the results of such monitoring and/or measurements to another terminal device and/or a network equipment. The terminal device may in this case be a machine-to-machine (M2M) device, which may in a 3 GPP context be referred to as a machine-type communication (MTC) device.

As one particular example, the terminal device may be a UE implementing the 3 GPP narrow band internet of things (NB-IoT) standard. Particular examples of such machines or devices are sensors, metering devices such as power meters, industrial machinery, or home or personal appliances, e.g. refrigerators, televisions, personal wearable computing device such as watches etc. In other scenarios, a terminal device may represent a vehicle or other equipment that is capable of monitoring and/or reporting on its operational status or other functions associated with its operation.

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof. The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Now some exemplary embodiments of the present disclosure will be described below with reference to the figures.

FIG. 1 shows a schematic diagram of a wireless communication network 100 in which embodiments of the disclosure may be implemented. As shown in FIG. 1, the wireless communication network 100 may include one or more network devices, for example network devices 101.

It will be appreciated that the network device 101 could also be in a form of gNB, Node B, eNB, BTS (Base Transceiver Station), and/or BSS (Base Station Subsystem), access point (AP) and the like. The network device 101 may provide radio connectivity to a set of terminal devices or UEs 102-1, 102-2, . . . , 102-N (collectively referred to as "terminal device(s) 102) within its coverage, where N is a natural number.

The network device 101 includes processing circuitry, device readable medium, interface, user interface equipment, auxiliary equipment, power source, power delivery circuitry, and antenna. These components are depicted as single boxes located within a single larger box, and in some cases, contain additional boxes therein.

In practice, however, the network device 101 may include multiple different physical components that make up a single illustrated component (e.g., interface includes ports/terminals for coupling wires for a wired connection and radio front end circuitry for a wireless connection). As another example, network device 101 may be a virtual network node. Similarly, a network node may be composed of multiple physically separate components (e.g., a NodeB component and a RNC component, a BTS component and a BSC component, etc.), which may each have their own respective components.

In certain scenarios in which a network device includes multiple separate components (e.g., BTS and BSC components), one or more of the separate components may be shared among several network nodes. For example, a single RNC may control multiple NodeBs. In such a scenario, each unique NodeB and RNC pair may in some instances be considered a single separate network node. In some embodiments, a network node may be configured to support multiple radio access technologies (RATs). In such embodiments, some components may be duplicated (e.g., separate device readable medium for the different RATs) and some components may be reused (e.g., the same antenna may be shared by the RATs).

Although the network device 101 illustrated in the example wireless communication network may represent a device that includes a particular combination of hardware components, other embodiments may include network nodes with different combinations of components. It is to be understood that a network device may include any suitable combination of hardware and/or software needed to perform the tasks, features, functions and methods disclosed herein.

It is to be understood that the configuration of FIG. 1 is described merely for the purpose of illustration, without suggesting any limitation as to the scope of the present disclosure. Those skilled in the art would appreciate that the wireless communication network 100 may include any suitable number of terminal devices and/or network devices and may have other suitable configurations.

Figure 2:
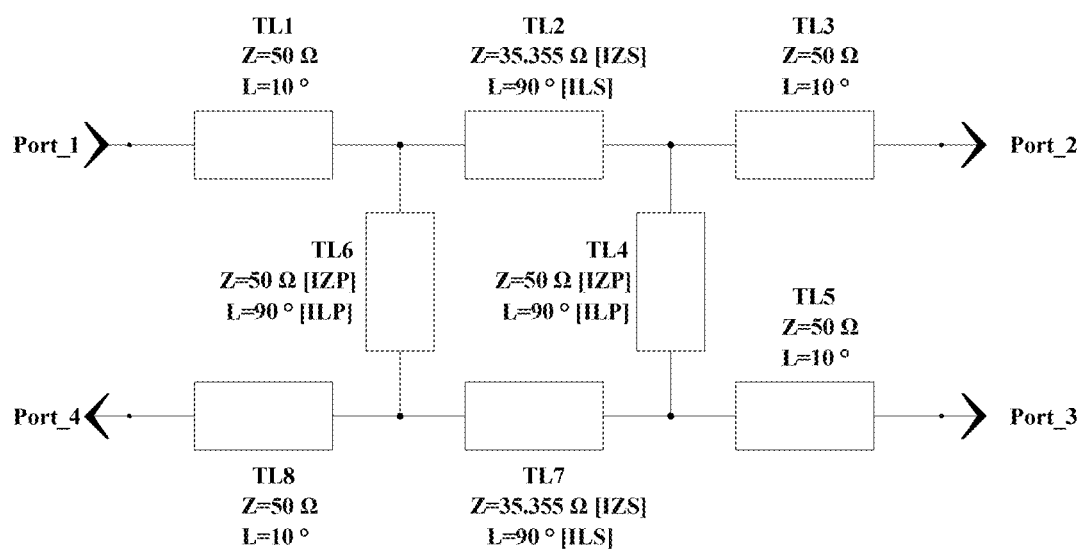
FIG. 2 is a schematic diagram which shows an exemplary quadrature hybrid structure as a combiner of Doherty power amplifier.

FIG. 2 is a schematic diagram which shows an exemplary quadrature hybrid structure as a combiner of Doherty power amplifier. As shown in FIG. 2, the combiner is formed by using quarter wavelength transmission lines and is arranged in a ring form, resulting in narrow bandwidths, such as <30%, and a large area, such as in a printed circuit board (PCB).

Figure 3:
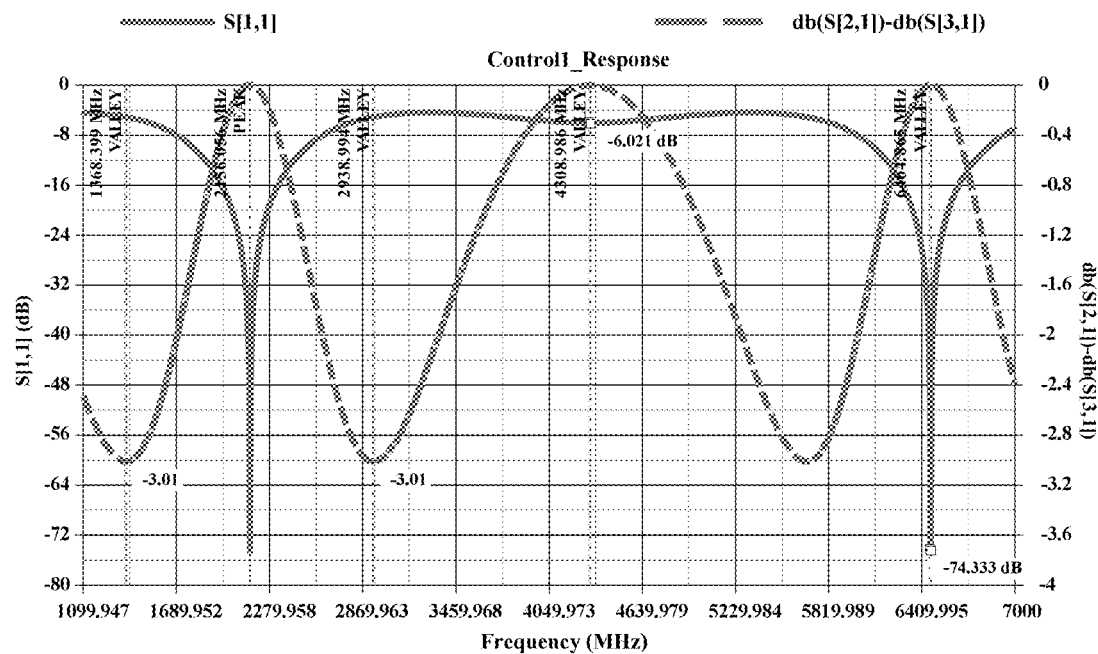
FIG. 3 is a schematic diagram which shows an exemplary bandwidth constrains of amplitude imbalance in the existing structure shown in FIG. 2.

FIG. 3 is a schematic diagram which shows an exemplary bandwidth constrains of amplitude imbalance in the structure shown in FIG. 2. As shown in FIG. 3, the frequency response of amplitude imbalance and return loss are illustrated.

It should be appreciated that some parameters (such as 50 Ohm, 10°, and so on) and/or elements (or components) in FIGS. 2 and 3 are examples in order to illustrate the scheme, but it is not limited thereto. Furthermore, details of some parameters (such as TL, Z, L, and so on) as examples in FIGS. 2 and 3 could refer to relevant arts.

As shown in FIGS. 2 and 3, one of issues is bandwidth limitation if a quadrature hybrid structure is used due to its inherent narrowband characteristic. In this disclosure, the "bandwidth limitation" of a combiner of Doherty power amplifier refers to not only insertion loss roll-off bandwidth, but also amplitude imbalance between at least two paths in the Doherty power amplifier, such as a carrier amplifier and a peaking amplifier. The issue is especially prominent for a quadrature hybrid structure because it is more sensitive to an amplitude imbalance.

Furthermore, the existing combiners of Doherty power amplifiers are fixed with unique or specific characteristics. In addition, there is no proper harmonic suppression function in the existing combiners of Doherty power amplifiers, especially for Gallium Nitride (GaN) High Electron Mobility Transistor (HEMT) power amplifier designs.

In view of the above issues, the disclosure proposes solutions to achieve one or more of flexible characteristic of impedance matching or termination, extending bandwidth but without adding too much PCB area budget, controllable size of a combiner of Doherty power amplifier for various application scenarios, and harmonic suppression function in the combiner of the Doherty power amplifier.

A First Aspect of Embodiments

A Doherty power amplifier is provided in this embodiment. The Doherty power amplifier may be implemented at a transmitter, such as a MIMO transmitter at a terminal device or at a network device.

Figure 4:
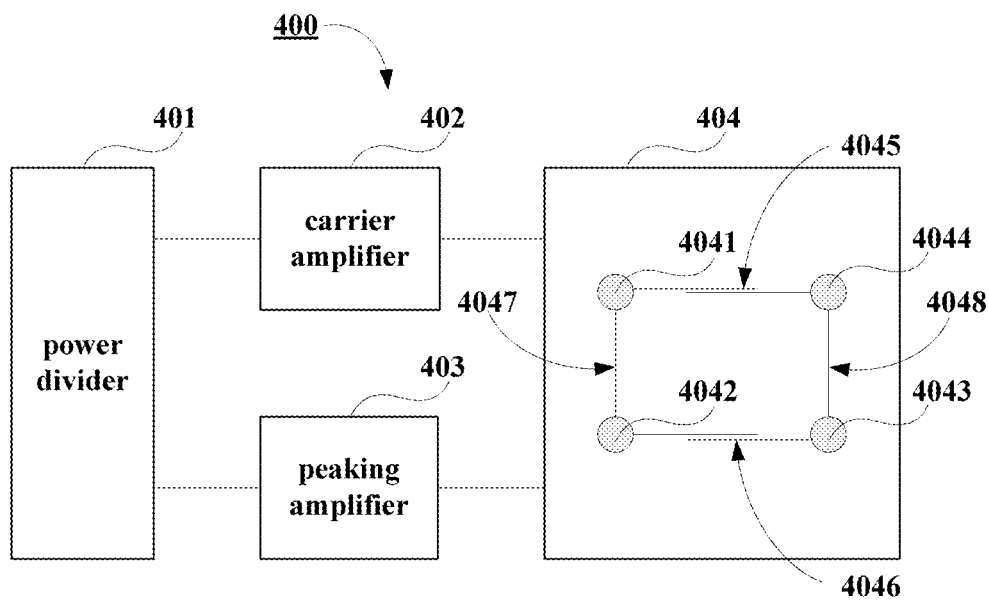
FIG. 4 is a schematic diagram which illustrates the Doherty power amplifier in accordance with an embodiment of the present disclosure.

FIG. 4 is a schematic diagram which illustrates the Doherty power amplifier in accordance with an embodiment of the present disclosure. As shown in FIG. 4, a Doherty power amplifier 400 at least includes a power divider 401, a carrier amplifier 402, a peaking amplifier 403 and a combiner 404;

As shown in FIG. 4, the combiner 404 is configured to combine output signals of the carrier amplifier 402 and the peaking amplifier 403; and the combiner 404 at least includes a first input port 4041, a second input port 4042, an output port 4043 and a termination port 4044.

In this disclosure, the first input port 4041 and the termination port 4044 are open coupled by at least two coupled microstrip lines 4045, and/or, the second input port 4042 and the output port 4043 are open coupled by at least two coupled microstrip lines 4046.

While the first input port 4041 and the second input port 4042 are connected by a quarter wavelength transmission line 4047, and/or, the termination port 4044 and the output port 4043 are connected by a quarter wavelength transmission line 4048.

In an embodiment, as for the "open coupled", for example, at least two microstrip lines are used; each microstrip line has an open coupled stub and one end of the open coupled stub remains a vacant state. But it is not limited thereto, details of "open coupled" could refer to relevant arts.

It should be appreciated that FIG. 4 is only an example of the disclosure, it is not limited thereto. For example, the links between blocks (or modules, components, and so on) may be adjusted and/or some blocks (or modules, components, and so on) may be omitted. Moreover, some blocks (or modules, components, and so on) not shown in FIG. 4 may be added.

Furthermore, the detail of some components (such as the power divider, the carrier amplifier and the peaking amplifier) could refer to some relevant arts and would be omitted in this disclosure.

In an embodiment, the coupled microstrip lines include open coupled stubs and are broadband equivalents of a low impedance quarter wavelength transmission line. Therefore, transmission line sections of low impedance section branch in existing solutions are replaced by open coupled stubs in this disclosure. This new structure can realize a very low amplitude imbalance over broadband, in comparison with the existing solutions.

For example, one exemplary embodiment of present disclosure may exhibit a broadband (such as of 63%) when 1-dB amplitude imbalance occurs at 2144 MHz center frequency, in comparison with the counterpart of the existing solutions of narrow-band (such as 27.4%) when 1-dB amplitude imbalance occurs. Also, a strong $2^{nd}$ harmonic suppression can be obtained in present disclosure, while the existing solutions can hardly provide any meaningful suppression for the $2^{nd}$ harmonic component.

In an embodiment, the first input port is connected to the carrier amplifier and the second input port is connected to the peaking amplifier, so as to form a non-inverted load modulation combiner.

Figure 5:
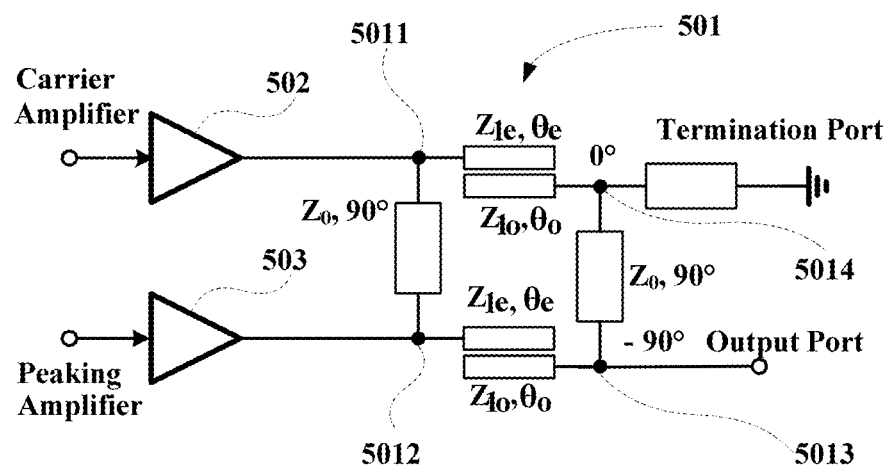
FIG. 5 is a schematic diagram which illustrates a non-inverted load modulation combiner in accordance with an embodiment of the present disclosure.

FIG. 5 is a schematic diagram which illustrates a non-inverted load modulation combiner in accordance with an embodiment of the present disclosure. As shown in FIG. 5, a combiner 501 is configured to combine output signals of a carrier amplifier 502 and a peaking amplifier 503.

As shown in FIG. 5, the combiner 501 at least includes a first input port 5011, a second input port 5012, an output port 5013 and a termination port 5014. The first input port 5011 is connected to the carrier amplifier 502 and the second input port 5012 is connected to the peaking amplifier 503.

As shown in FIG. 5, the first input port 5011 and the termination port 5014 are open coupled by at least two coupled microstrip lines (for example, as denoted by $Z_{1e}$, $\theta_e$ and $Z_{1o}$, $\theta_o$), and/or, the second input port 5012 and the output port 5013 are open coupled by at least two coupled microstrip lines (for example, as denoted by $Z_{1e}$, $\theta_e$ and $Z_{1o}$, $\theta_o$).

While the first input port 5011 and the second input port 5012 are connected by a quarter wavelength transmission line (for example, as denoted by $Z_0$, 90°), and/or, the termination port 5014 and the output port 5013 are connected by a quarter wavelength transmission line (for example, as denoted by $Z_0$, 90°).

In an embodiment, the first input port is connected to the peaking amplifier and the second input port is connected to the carrier amplifier, so as to form an inverted load modulation combiner.

Figure 6:
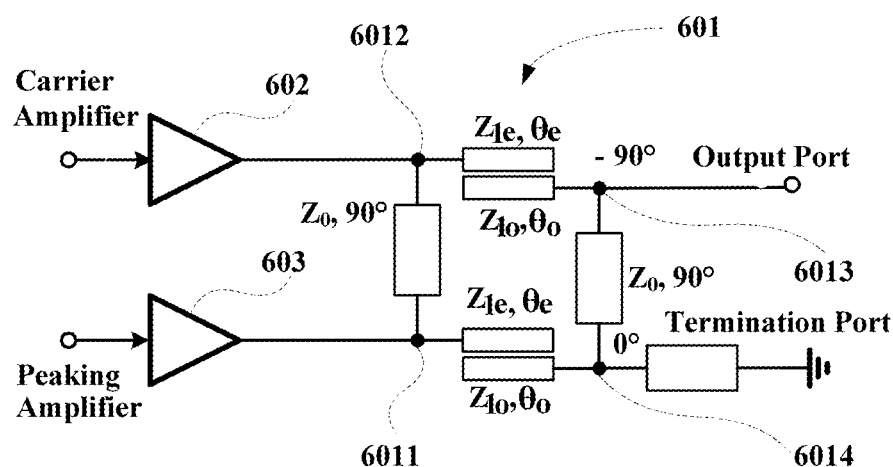
FIG. 6 is a schematic diagram which illustrates an inverted load modulation combiner in accordance with an embodiment of the present disclosure.

FIG. 6 is a schematic diagram which illustrates an inverted load modulation combiner in accordance with an embodiment of the present disclosure. As shown in FIG. 6, a combiner 601 is configured to combine output signals of a carrier amplifier 602 and the peaking amplifier 603.

As shown in FIG. 6, the combiner 601 at least includes a first input port 6011, a second input port 6012, an output port 6013 and a termination port 6014. the first input port 6011 is connected to the peaking amplifier 603 and the second input port 6012 is connected to the carrier amplifier 602.

As shown in FIG. 6, the first input port 6011 and the termination port 6014 are open coupled by at least two coupled microstrip lines, and/or, the second input port 6012 and the output port 6013 are open coupled by at least two coupled microstrip lines.

While the first input port 6011 and the second input port 6012 are connected by a quarter wavelength transmission line, and/or, the termination port 6014 and the output port 6013 are connected by a quarter wavelength transmission line.

It should be appreciated that FIGS. 5-6 are only examples of the disclosure, it is not limited thereto. For example, the links between blocks (or modules, components, and so on) may be adjusted and/or some blocks (or modules, components, and so on) may be omitted. Moreover, some blocks (or modules, components, and so on) not shown in FIGS. 5-6 may be added. Furthermore, details of some parameters (such as $Z_0$) as examples in FIGS. 5-6 could refer to existing technologies.

In this disclosure, at least one section of the combiner with improved flat balance over broadband can be realized. Furthermore, multiple sections could be cascaded together to further enhance the bandwidth performance.

Also, this disclosure can be implemented with proper load termination on an unused port for various application scenarios. It is rather flexible to be tuned for broadband and high power with improved voltage standing wave ratio (VSWR) performance.

To realize broadband of the Doherty power amplifier, one of points of this disclosure is that relative lower impedance transformer section (such as real-to-real impedance transformer section) of traditional two-section combiner of Doherty power amplifier is replaced by equivalent parallel open coupled transmission lines.

In this disclosure, the broadband performance is realized by neither using multiple sections, ground plane structures or lump elements, nor series stubs, but by a parallel open coupled microstrip lines. By doing this, flat balanced frequency response is obtained over broader balanced bandwidth. Therefore, a single section broadband combiner of Doherty power amplifier is comparable to multi-section combiner of Doherty power amplifier in bandwidth performance but being realized in rather compact area.

Next the coupled microstrip lines will be further illustrated as examples.

In an embodiment, the coupled microstrip lines may include open coupled stubs and may be broadband equivalents of a low impedance quarter wavelength transmission line. As for the "equivalents" or "equivalent" or "equivalently", for example, they are some generic terms in the arts, and it is not limited thereto, details of those terms could refer to relevant arts.

In an embodiment, the coupled microstrip lines have relatively low equivalent impedance while the quarter wavelength transmission lines have relatively high impedance. For example, the equivalent impedance of the quarter wavelength transmission lines is higher than the equivalent impedance of the coupled microstrip lines.

In an embodiment, an even mode electrical length and an odd mode electrical length of the coupled microstrip lines are equal. Alternatively or optionally, an even mode impedance of the coupled microstrip lines is in a range of 100~200 Ohm, while an odd mode impedance of the coupled microstrip lines is in a range of 20~100 Ohm. It is not limited thereto in this disclosure.

In an embodiment, when a value of a coupling factor of the coupled microstrip lines is higher, an obtained bandwidth of balanced amplitude is broader.

Figure 7:
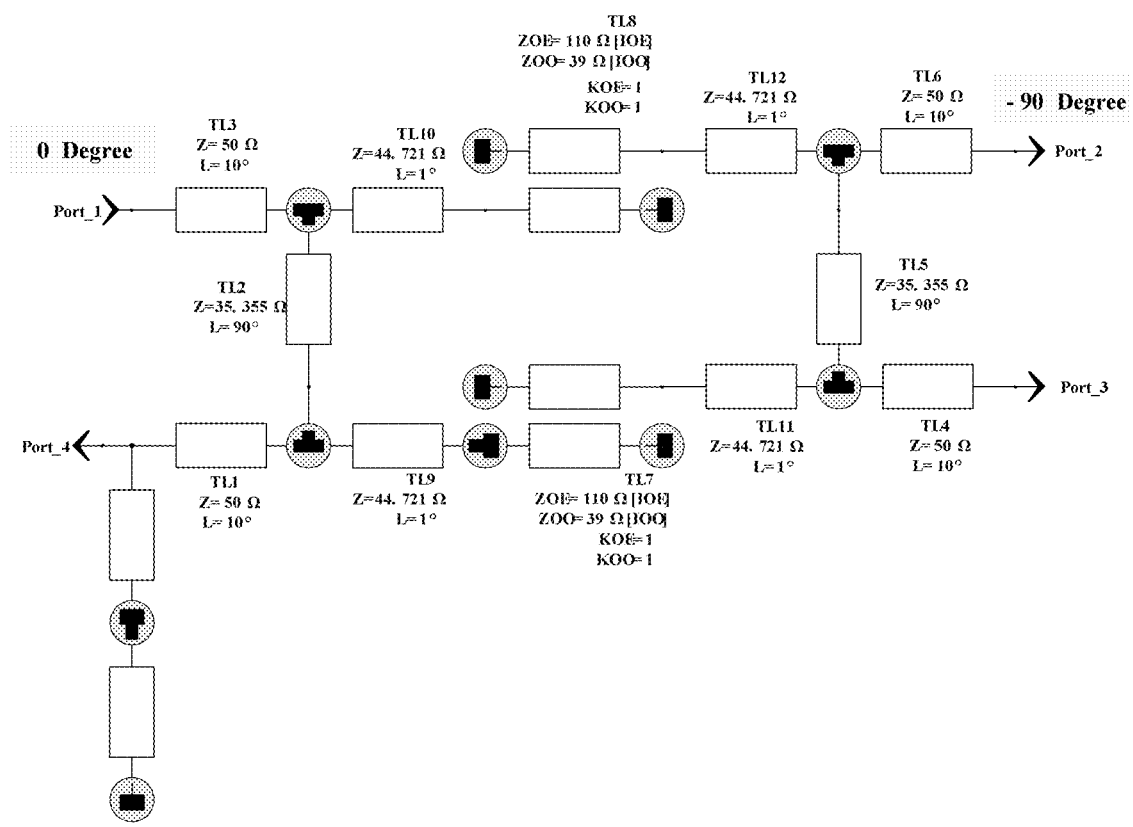
FIG. 7 is a schematic diagram which shows an example of the combiner in accordance with an embodiment of the present disclosure.

FIG. 7 is a schematic diagram which shows an example of the combiner in accordance with an embodiment of the present disclosure. The open coupled stub could be equivalent of a single section transmission line.

For example, the even mode and odd mode impedance and electrical lengths of the open coupled stubs are $Z_{OE}$ and $Z_{OO}$, $\theta_E=\theta_O=\theta$, respectively. $Z_{OE}$ is in the range of 100~200 Ohm, $Z_{OO}$ is in the range of 20~100 Ohm, while $\theta$ is the same value for both even mode and odd mode length. $Z_{OE}$ may be always greater than $Z_{OO}$.

For example, a coupling factor $K=(Z_{OE}-Z_{OO})/(Z_{OE}+Z_{OO})$, where $0<K<1$. When the value of K is higher, a broader bandwidth of balanced amplitude could be obtained.

It should be appreciated that some parameters (such as 50 Ohm, 90°, and so on) and/or elements (or components) in FIG. 7 are examples in order to illustrate the scheme of this disclosure, but it is not limited thereto. Furthermore, details of some parameters (such as Z, L) as examples in FIG. 7 could refer to existing technologies.

In an embodiment, load of the termination port may include one or more of an open stub, a short stub, and an equivalent lumped reactive load. Alternatively or optionally, load of the termination port has a same effect as placing offset lines in series with the first input port and the second input port for the output signals of the carrier amplifier and the peaking amplifier, respectively.

In an embodiment, tradeoff between an intermodulation distortion level and efficiency of the Doherty power amplifier is realized, by adjusting an equivalent electrical length of the load of the termination port.

For example, the lower impedance transformer or real-to-real impedance transformer, such as ($Z_1$, 90) transmission line, of a classic combiner of Doherty power amplifier is replaced by a well-controlled parallel coupled transmission lines of this disclosure.

For example, the Doherty power amplifier of this disclosure may closely place microstrip lines in parallel to have even mode and odd mode electrical lengths($Z_{1e}$, $\theta_e$) and s ($Z_{1o}$, $\theta_o$) respectively. They have the same even mode and odd mode electrical lengths as $\theta_e=\theta_o=\theta$.

In an embodiment, one or more of the following lines may be configured to be U-shaped folded structures: the coupled microstrip lines between the first input port and the termination port; the coupled microstrip lines between the second input port and the output port; the quarter wavelength transmission line between the first input port and the second input port; and the quarter wavelength transmission line between the output port and the termination port.

Figure 8:
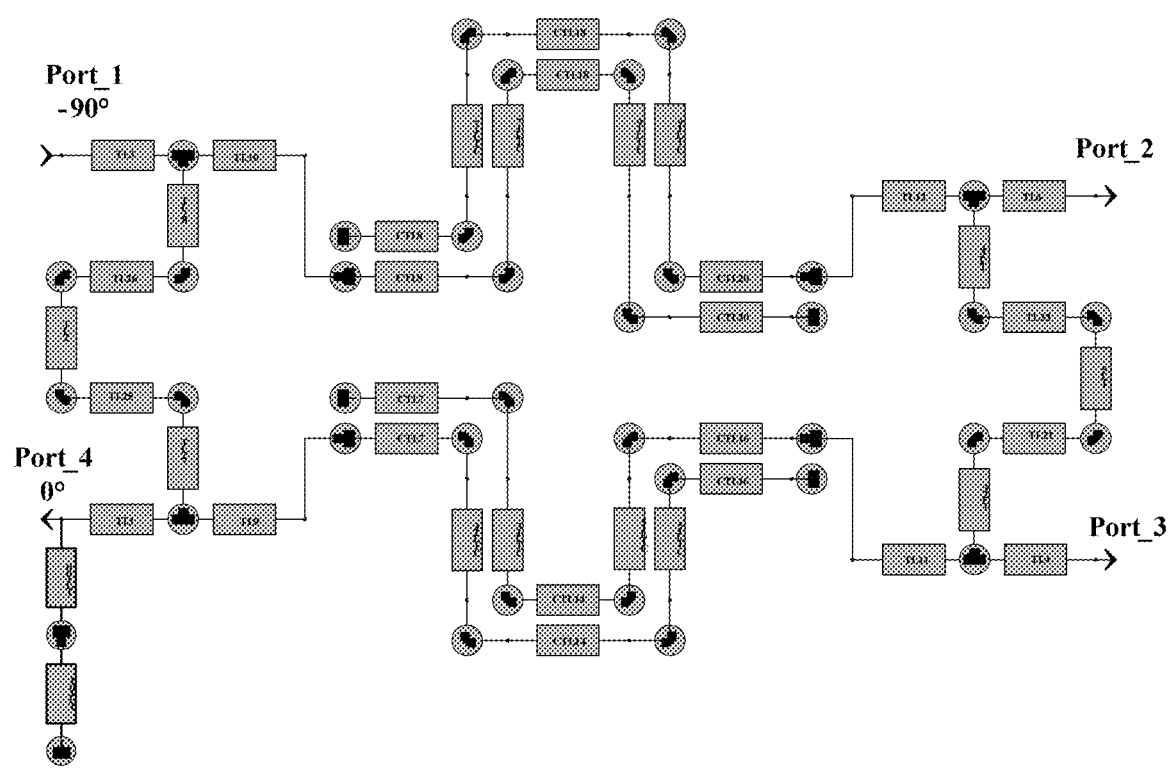
FIG. 8 is a schematic diagram which shows an example of the combiner in accordance with an embodiment of the present disclosure.

FIG. 8 is a schematic diagram which shows an example of the combiner in accordance with an embodiment of the present disclosure. As shown in FIG. 8, at least one "U turn"

is used in either high impedance or low impedance quarter wavelength lines to minimize the overall size of the combiner of the Doherty power amplifier.

The open coupled stubs may also contain at least one "U turn" without degrading the performance Therefore, it could be potentially small size when multiple "U turn" structure is used, which could be meaningful for product volume miniaturization.

It should be appreciated that some parameters (such as 90°, and so on) and/or elements (or components) in FIG. 8 are examples in order to illustrate the scheme of this disclosure, but it is not limited thereto. Furthermore, details of some parameters, such as TL (transmission line), CTL (coupled transmission line), as examples in FIG. 8 could refer to existing technologies.

In an embodiment, amplitude imbalance and/or a second harmonic of the Doherty power amplifier may be suppressed by using the coupled microstrip lines. For example, to verify the performance of the present disclosure, one exemplary design simulation at 2144 MHz center frequency is performed in comparison of the counter part of the existing solutions.

Figure 9:
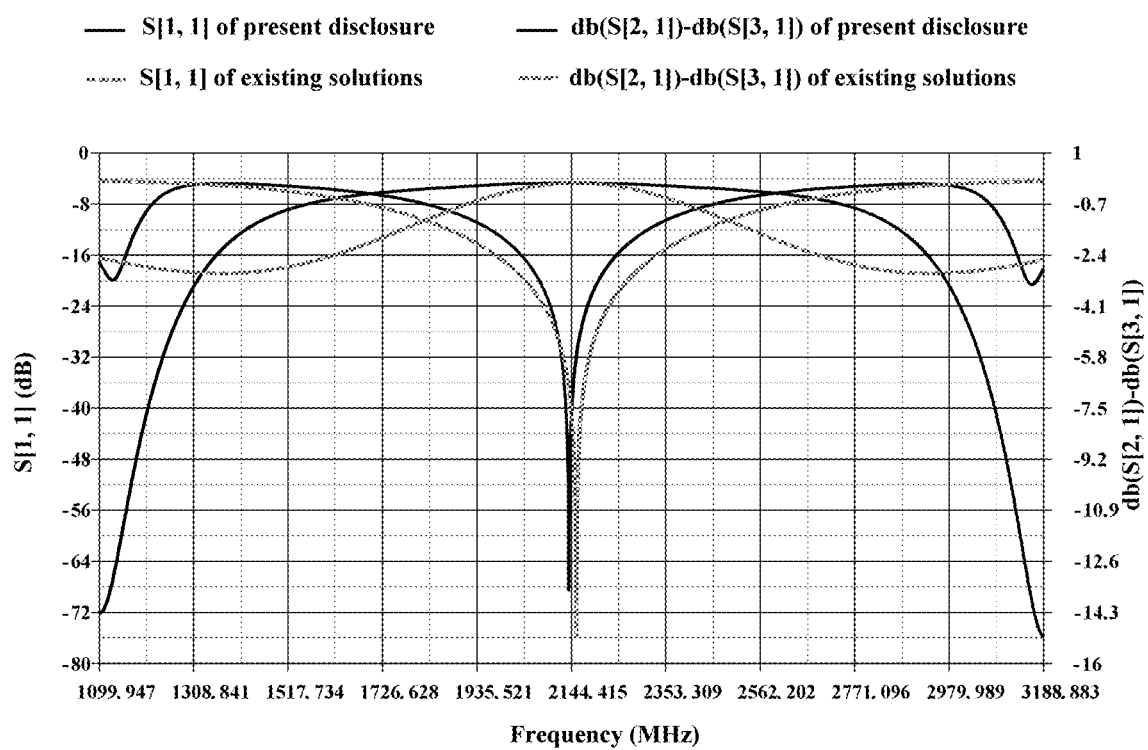
FIG. 9 is a schematic diagram which shows an exemplary bandwidth constrains of amplitude imbalance of this disclosure versus the existing solutions.

FIG. 9 is a schematic diagram which shows an exemplary bandwidth constrains of amplitude imbalance of this disclosure versus the existing solutions. As shown in FIG. 9, the frequency response of amplitude imbalance and return loss are illustrated; a balanced amplitude bandwidth can be obtained and it is much broader than that of the existing solutions.

Figure 10:
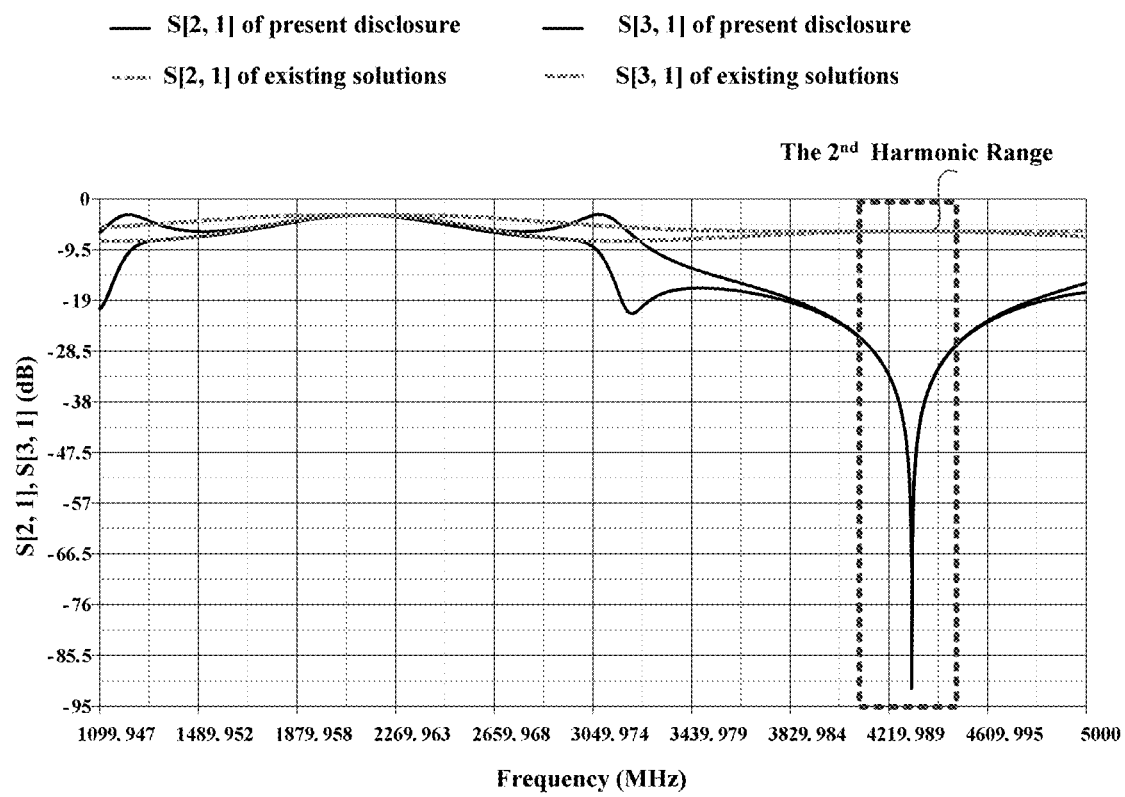
FIG. 10 is a schematic diagram which shows an example of the $2^{nd}$ harmonic suppression in accordance with an embodiment of the present disclosure.

FIG. 10 is a schematic diagram which shows an example of the $2^{nd}$ harmonic suppression in accordance with an embodiment of the present disclosure. As shown in FIG. 10, the $2^{nd}$ harmonic can be highly suppressed in this disclosure compared to the existing solutions, such that product spectrum mask requirements could be met.

As can be seen from the above embodiments, in a combiner of Doherty power amplifier, a first input port and a termination port are open coupled by at least two coupled microstrip lines and/or a second input port and an output port are open coupled by at least two coupled microstrip lines.

Therefore, a balanced amplitude bandwidth can be obtained and it is much broader than that of the existing solutions, which is promising for a broadband Doherty power amplifier with good consistency in output power and linearity.

In addition, a controllable size or a potentially small size of a combiner of Doherty power amplifier in this disclosure can be realized, which could be meaningful for product volume miniaturization.

Furthermore, the Doherty power amplifier in this disclosure can provide great $2^{nd}$ harmonic suppression to meet product spectrum mask requirements; and flexible characteristic of impedance matching or termination can be obtained.

A Second Aspect of Embodiments

A transmitter also is provided in an embodiment. Next a transmitter is illustrated as an example, but it is not limited thereto.

Figure 11:
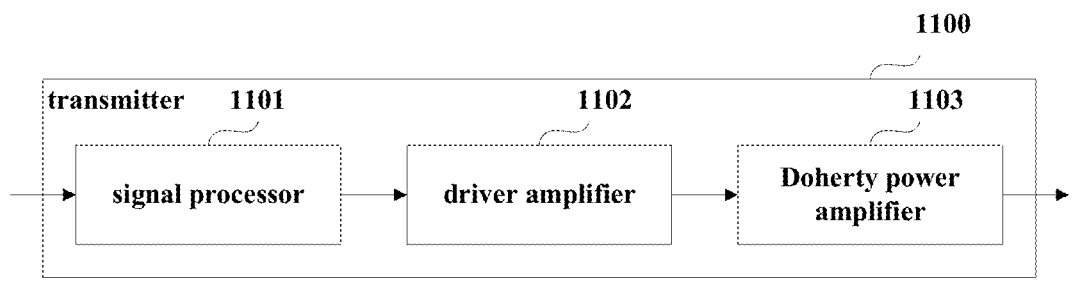
FIG. 11 shows a diagram of a transmitter in accordance with an embodiment of the present disclosure.

FIG. 11 shows a diagram of a transmitter 1100 in accordance with an embodiment of the present disclosure; as shown in FIG. 11, the transmitter 1100 includes a signal processor 1101, a driver amplifier 1102 and a Doherty power amplifier 1103.

For the signal processor 1101 and the driver amplifier 1102, the existing solutions may be referred to, and for the Doherty power amplifier 1103, the first aspect of embodiments may be referred to, which has been described in details in the first aspect of embodiments, and thus not be described herein any further.

A Third Aspect of Embodiments

An apparatus is provided in these embodiments.

Figure 12:
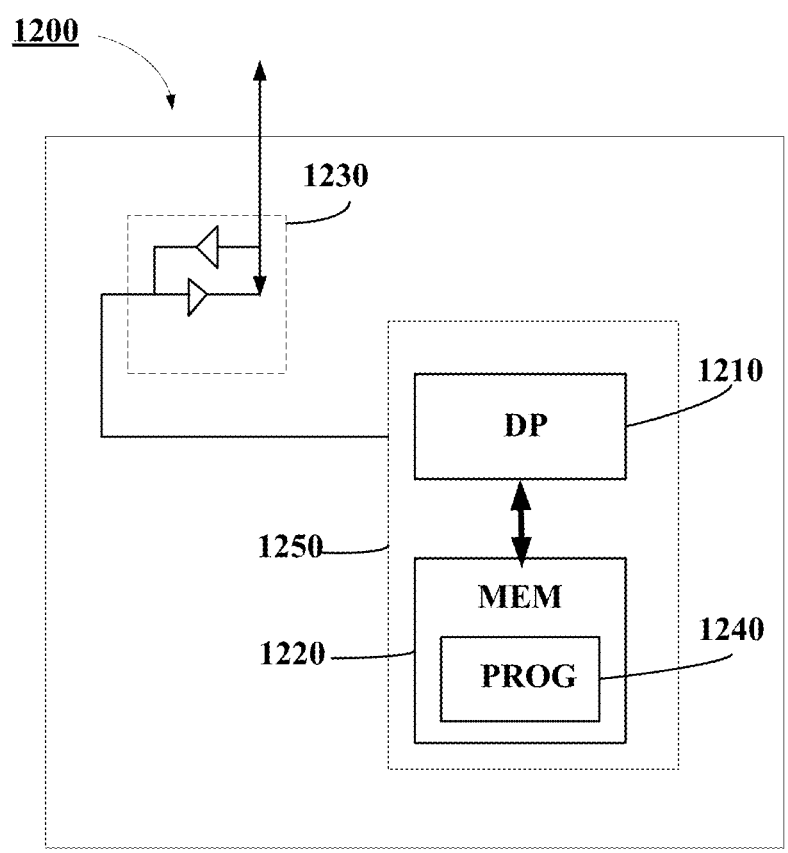
FIG. 12 shows a simplified block diagram of an apparatus in accordance with an embodiment of the present disclosure.

FIG. 12 shows a simplified block diagram of an apparatus 1200 in accordance with an embodiment of the present disclosure. It would be appreciated that the apparatus 1200 may be implemented as at least a part of, for example, a network device or a terminal device, especially may be implemented as at least a part of, for example, a transmitter or a transceiver included in a network device or a terminal device.

As shown in FIG. 12, the apparatus 1200 includes: a communicating means 1230 and a processing means 1250. The processing means 1250 includes a data processor (DP) 1210, a memory (MEM) 1220 coupled to the DP 1210. The communicating means 1230 is coupled to the DP 1210 in the processing means 1250. The MEM 1220 stores a program (PROG) 1240. The communicating means 1230 is for communications with other devices, which may be implemented as a transceiver for transmitting/receiving signals.

In some embodiments, the apparatus 1200 acts as a network device, the processing means 1250 may be configured to perform signal processing to an input signal and obtain an output signal, and the communicating means 1230 may be configured to transmit the output signal or receive an output signal transmitted by a terminal device.

In some other embodiments, the apparatus 1200 acts as a terminal device, the processing means 1250 may be configured to perform signal processing to an input signal and obtain an output signal, and the communicating means 1230 may be configured to transmit the output signal or receive an output signal transmitted by a network device.

The PROG 1240 is assumed to include program instructions that, when executed by the associated DP 1210, enable the apparatus 1200 to operate in accordance with the embodiments of the present disclosure. The embodiments herein may be implemented by computer software executable by the DP 1210 of the apparatus 1200, or by hardware, or by a combination of software and hardware. A combination of the data processor 1210 and MEM 1220 may form processing means 1250 adapted to implement various embodiments of the present disclosure.

The MEM 1220 may be of any type suitable to the local technical environment and may be implemented using any suitable data storage technology, such as semiconductor based memory devices, magnetic memory devices and systems, optical memory devices and systems, fixed memory and removable memory, as non-limiting examples. While only one MEM is shown in the apparatus 1200, there may be several physically distinct memory modules in the apparatus 1200. The DP 1210 may be of any type suitable to the local technical environment, and may include one or more of general purpose computers, special purpose computers, microprocessors, digital signal processors (DSPs) and processors based on multicore processor architecture, as non-limiting examples. The apparatus 1200 may have multiple processors, such as an application specific integrated circuit chip that is slaved in time to a clock which synchronizes the main processor.

A device (such as a terminal device or a network device, not shown) is provided in an embodiment, the device includes the apparatus 1200, and the same contents as those in the first aspect and the second aspect of embodiments are omitted.

It will be appreciated that embodiments of the disclosure described herein may be comprised of one or more conventional processors and unique stored program instructions that control the one or more processors to implement, in conjunction with certain non-processor circuits, some, most, or all of the functions of generating a multicarrier communication signal having a reduced crest factor as described herein. The non-processor circuits may include, but are not limited to, a radio transmitter, signal drivers, clock circuits, power source circuits, and user input devices. As such, these functions may be interpreted as blocks of a method for generating a signal having a reduced crest factor. Alternatively, some or all functions could be implemented by a state machine that has no stored program instructions, or in one or more application specific integrated circuits (ASICs), in which each function or some combinations of certain of the functions are implemented as custom logic. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

For example, one or more of the examples described herein may be implemented in a field programmable gate array (FPGA), typically includes an array of programmable tiles. These programmable tiles can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or another computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

By way of example, embodiments of the present disclosure can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general-purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

The above program code may be embodied on a machine readable medium, which may be any tangible medium that may contain, or store a program for use by or in connection with an instruction execution system, apparatus, or device. The machine-readable medium may be a machine-readable signal medium or a machine-readable storage medium. The machine-readable medium may include but not limited to an electronic, magnetic, optical, electromagnetic, infrared, or semiconductor system, apparatus, or device, or any suitable combination of the foregoing.

More specific examples of the machine-readable storage medium would include an electrical connection having one or more wires, a portable computer diskette, a hard disk, a random-access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this disclosure, the device may be implemented in the general context of computer system-executable instructions, such as program modules, being executed by a computer system. Generally, program modules may include routines, programs, objects, components, logic, data structures, and so on that perform particular tasks or implement particular abstract data types. The device may be practiced in distributed cloud computing environments where tasks are performed by remote processing devices that are linked through a communications network. In a distributed cloud computing environment, program modules may be located in both local and remote computer system storage media including memory storage devices.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A Doherty power amplifier comprising a power divider, a carrier amplifier, a peaking amplifier and a combiner,
    wherein the combiner is configured to combine output signals of the carrier amplifier and the peaking amplifier and comprise a first input port, a second input port, an output port, and a termination port,
    wherein the first input port and the termination port are open coupled by two coupled microstrip lines,
    wherein the second input port and the output port are open coupled by two coupled microstrip lines,
    wherein the first input port and the second input port are connected by a quarter wavelength transmission line,
    wherein the termination port and the output port are connected by a quarter wavelength transmission line,
    wherein the coupled microstrip lines and/or the quarter wavelength transmission lines are configured to be U-shaped folded structures, and
    wherein the two coupled microstrip lines have relatively low equivalent port impedance while the quarter wavelength transmission lines have relatively high port impedance.

2. The Doherty power amplifier of claim 1, wherein the first input port is connected to the carrier amplifier, and
    wherein the second input port is connected to the peaking amplifier to form a non-inverted load modulation combiner.

3. The Doherty power amplifier of claim 1, wherein the first input port is connected to the peaking amplifier, and
    wherein the second input port is connected to the carrier amplifier to form an inverted load modulation combiner.

4. The Doherty power amplifier of claim 1, wherein the two coupled microstrip lines comprise open coupled stubs and are broadband equivalents of a low impedance quarter wavelength transmission line.

5. The Doherty power amplifier of claim 1, wherein the two coupled microstrip lines between the first input port and the termination port are equivalently parallel to the two coupled microstrip lines between the second input port and the output port.

6. The Doherty power amplifier of claim 1, wherein load of the termination port comprises one or more of an open stub, a short stub, and an equivalent reactive load.

7. The Doherty power amplifier of claim 1, wherein load of the termination port has a same effect as placing offset lines in series with the first input port and the second input port for the output signals of the carrier amplifier and the peaking amplifier, respectively.

8. The Doherty power amplifier of claim 7, wherein an equivalent electrical length of the load of the termination port is configured to be adjusted to realize tradeoff between an intermodulation distortion level and efficiency of the Doherty power amplifier.

9. The Doherty power amplifier of claim 1, wherein the two coupled microstrip lines are configured to manipulate amplitude imbalance and/or a second harmonic level of the Doherty power amplifier by switching between an open state and a closed state.

10. The Doherty power amplifier of claim 1, wherein an even mode impedance of the two coupled microstrip lines is in a range of 100~200 Ohm, while an odd mode impedance of the two coupled microstrip lines is in a range of 20~100 Ohm.

11. The Doherty power amplifier of claim 1, wherein the higher a value of a coupling factor of the two coupled microstrip lines is, the broader an obtained bandwidth of a balanced amplitude is.

12. The Doherty power amplifier of claim 1, wherein an even mode electrical length and an odd mode electrical length of the two coupled microstrip lines are equal.

13. A device comprising:
    a Doherty power amplifier comprising a power divider, a carrier amplifier, a peaking amplifier and a combiner,
        wherein the combiner is configured to combine output signals of the carrier amplifier and the peaking amplifier and comprise a first input port, a second input port, an output port, and a termination port,
        wherein the first input port and the termination port are open coupled by two coupled microstrip lines,
        wherein the second input port and the output port are open coupled by two coupled microstrip lines,
        wherein the first input port and the second input port are connected by a quarter wavelength transmission line,
        wherein the termination port and the output port are connected by a quarter wavelength transmission line,
        wherein the coupled microstrip lines and/or the quarter wavelength transmission lines are configured to be U-shaped folded structures, and
        wherein the two coupled microstrip lines are configured to manipulate amplitude imbalance and/or a second harmonic level of the Doherty power amplifier by switching between an open state and a closed state.

14. The device of claim 13, wherein load of the termination port comprises one or more of an open stub, a short stub, and an equivalent reactive load.

15. The device of claim 13, wherein the two coupled microstrip lines have relatively low equivalent port impedance while the quarter wavelength transmission lines have relatively high port impedance.

16. The device of claim 13, wherein the device is a terminal device or a network device in a communication system.

17. The device of claim 13, wherein the first input port is connected to the carrier amplifier, and
    wherein the second input port is connected to the peaking amplifier to form a non-inverted load modulation combiner.

18. The device of claim 13, wherein the first input port is connected to the peaking amplifier, and
    wherein the second input port is connected to the carrier amplifier to form an inverted load modulation combiner.

19. The device of claim 13, wherein the two coupled microstrip lines comprise open coupled stubs and are broadband equivalents of a low impedance quarter wavelength transmission line.

20. The device of claim 13, wherein the two coupled microstrip lines between the first input port and the termination port are equivalently parallel to the two coupled microstrip lines between the second input port and the output port.

* * * * *